(12) United States Patent
Huang et al.

(10) Patent No.: US 12,063,790 B2
(45) Date of Patent: Aug. 13, 2024

(54) STRUCTURE AND METHOD FOR MRAM DEVICES

(71) Applicant: Taiwan Semiconductor Manufacturing Company, Ltd., Hsinchu (TW)

(72) Inventors: Chih-Fan Huang, Kaohsiung (TW); Wen-Chiung Tu, New Taipei (TW); Liang-Wei Wang, Hsinchu (TW); Dian-Hau Chen, Hsinchu (TW); Yen-Ming Chen, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 408 days.

(21) Appl. No.: 17/460,627

(22) Filed: Aug. 30, 2021

(65) Prior Publication Data

US 2023/0062842 A1 Mar. 2, 2023

(51) Int. Cl.
*H01L 29/82* (2006.01)
*H10B 61/00* (2023.01)
(Continued)

(52) U.S. Cl.
CPC .............. *H10B 61/22* (2023.02); *H10N 50/01* (2023.02); *H10N 50/10* (2023.02); *H10N 50/80* (2023.02)

(58) Field of Classification Search
CPC ........ H10B 61/22; H10B 69/00; H10B 10/12; H10B 12/50; H10B 12/09; H10B 10/00; H10B 41/30; H10B 63/30; H10B 41/35; H10B 63/845; H10B 12/053; H10B 43/27; H10B 43/40; H10B 10/125; H10B 12/05; H10B 43/20; H10B 12/482; H10B 20/00;
(Continued)

(56) References Cited

U.S. PATENT DOCUMENTS 7,022,602 B2   4/2006   Ruelke et al.
7,368,379 B2   5/2008   Tsao et al.
(Continued)

OTHER PUBLICATIONS

Huang, Chih-Fan et al., "MRAM Structure for Balanced Loading", U.S. Appl. No. 17/002,098, filed Aug. 25, 2020, Assignee: Taiwan Semiconductor Manufacturing Co., Ltd., Specification and Drawings, 33 pages.

*Primary Examiner* — Niki H Nguyen
(74) *Attorney, Agent, or Firm* — HAYNES AND BOONE, LLP (57) ABSTRACT

Semiconductor device and methods of forming the same are provided. A semiconductor device according to one embodiment includes a first source/drain feature and a second source/drain feature, a first metal line disposed in a first dielectric layer and electrically connected to the first source/drain feature, a second metal line disposed in the first dielectric layer and electrically connected to the second source/drain feature, and a first memory element disposed over the first dielectric layer and electrically connected to the first source/drain feature by way of the first metal line. A width of the first metal line is different from a width of the second metal line. By changing the widths of the first metal line and the second metal line, a source line series resistance of a semiconductor device can be advantageously reduced without changing a pitch of two metal lines.

20 Claims, 9 Drawing Sheets

(51) Int. Cl.
*H10N 50/01* (2023.01)
*H10N 50/10* (2023.01)
*H10N 50/80* (2023.01)

(58) Field of Classification Search
CPC ........ H10B 41/40; H10B 41/20; H10B 41/41; H10B 20/20; H10B 63/80; H10B 63/84; H10B 41/27; H10B 12/315; H10B 41/10; H10B 43/35; H10B 63/34; H10B 63/20; H10B 12/0335; H10B 12/488; H10B 43/10; H10B 12/00; H10B 12/30; H10B 12/485; H10B 61/00; H10B 43/30; H10B 12/033; H10B 12/48; H10B 43/50; 10/18; H10B 61/10; H10B 99/00; H10B 63/00; H10B 12/03; H10B 12/056; H10B 12/31; H10B 53/00; H10B 12/36; H10B 61/20; H10B 41/60; H10B 51/10; H10B 41/23; H10B 41/70; H10B 51/40; H10B 12/036; H10B 20/34; H10B 12/02; H10B 51/00; H10B 53/10; H10B 12/20; H10B 63/24; H10N 50/80; H10N 50/01; H10N 50/10

See application file for complete search history.

(56) References Cited

U.S. PATENT DOCUMENTS

| | | |
|---|---|---|
| 9,209,079 B2 | 12/2015 | Chi et al. |
| 9,437,484 B2 | 9/2016 | JangJian et al. |
| 9,443,804 B2 | 9/2016 | Shroff et al. |
| 9,646,876 B2 | 5/2017 | Padhi et al. |
| 10,510,803 B2 | 12/2019 | Chuang et al. |
| 2010/0252930 A1 | 10/2010 | Liao et al. |
| 2015/0270271 A1* | 9/2015 | Sakamoto ............ H10B 12/318 257/306 |
| 2017/0069827 A1* | 3/2017 | Lee ........................ H10N 50/85 |
| 2020/0266339 A1 | 8/2020 | Peng et al. |
| 2021/0257293 A1 | 8/2021 | Lee et al. |

\* cited by examiner

STRUCTURE AND METHOD FOR MRAM DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Modern day electronic devices contain volatile or non-volatile electronic memory to store data. Volatile memory stores data while it is powered, while non-volatile memory is able to retain stored data when power is removed. Magneto-resistive random-access memory (MRAM) is one promising candidate for a next generation non-volatile memory technology. MRAM devices may be embedded in an interconnect structure disposed over a device substrate and are controlled by driving transistors on the device substrate. An MRAM cell includes a magnetic tunnel junction (MTJ) vertically arranged between a top electrode over the MTJ and a bottom electrode below the MTJ. The MTJ includes a pinned layer separated from a free layer by a tunnel barrier layer and may digitally stores data. Scaling of MRAM cells in advanced technology nodes is limited by the resolution limit of both lithography and etching techniques. As the MRAM cells are scaled down, series resistance to the MRAM cells are increased in some cases, leading to higher power consumption. Although existing approaches in MRAM device formation have generally been adequate for their intended purposes, they have not been entirely satisfactory in all respects. Accordingly, there exists a need for improvements.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A semiconductor device with embedded MRAM cells includes an MRAM cell region and a logic region. The logic region and the MRAM cell region may be disposed in different regions in the semiconductor device. For example, the MRAM cell region may be located at the center of the semiconductor device while the logic region may be located at a periphery of the semiconductor device. However, such an example is not intended to be limiting. Other arrangements of the MRAM cell region and the logic region fall within the contemplated scope of the present disclosure. The MRAM cell region may include an array of MRAM cells arranged into row and columns. The MRAM cells in the same row may be connected to a common word line, and the MRAM cells in the same column may be connected to a common bit line. In some embodiments, the MRAM cell region includes the array of MRAM cells embedded in an interconnect structure prepared in a back-end-of-line (BEOL) operation and an array of driving transistors disposed in the front-end-of-line (FEOL) level. The MRAM cells are controlled by the array of driving transistors. Each of the driving transistors includes a first source/drain feature, a second source/drain feature, and a gate structure. The top electrode of a MRAM cell is coupled to a bit line (BL) and the bottom electrode of the MRAM cell is coupled to the first source/drain feature of the corresponding driving transistor. A source line (SL) is electrically coupled to the second source/drain feature of the corresponding driving transistor. The gate structure of the driving transistor is coupled to a word line (WL). When the word line (WL) is selected by application of an enabling voltage, the driving transistor is turned on and the MRAM cell is coupled between the bit line (BL) and the source line (SL). The bit line (BL) may also be coupled to a switching transistor.

Continuing scaling-down gives rises to new challenges. As described above, the MRAM cells are disposed in the interconnect structure formed in BEOL processes while the driving transistors are formed in FEOL processes. In some instances, the first corresponding metal layer immediately over the driving transistor includes a source line coupled to the second source/drain feature and a metal island coupled to the first source/drain feature. As the MRAM array includes multiple MRAM cells, two or more of the second source/drain features of multiple driving transistors may be coupled to the same source line. Thus, the source line may need to travel a long distance to be electrically connected to the second source/drain features of the multiple driving transistors. The increased length and thus resistance in the source line may bog down the signal transmitted along the source line. This increased resistance may further disadvantageously increase the resistance bias between the source line and the bit line. In high-switching read/write operations of MRAM cells, such a resistance bias may cause imbalance between the read operations and write operations. With respect to a free layer of an MRAM cell, the switching between the non-parallel state and the parallel requires application of voltage of different polarities. When the switching from the parallel state to the non-parallel state requires a different time or voltage than switching from the non-parallel state to the parallel state, the performance of the MRAM cell may be impacted.

The present disclosure provides methods and structures to reduce the resistance in the source line (SL) and thus reduce the resistance bias during write and read operations and improve the performance of an MRAM device. In some embodiments, a workpiece includes a transistor having a first and a second source/drain features and a first metal layer including a source line and a metal island. An MRAM cell is formed over the transistor and includes a bottom electrode coupled to the first source/drain feature through the metal island and a number of conductive features (e.g., contact vias and metal lines). A source line (SL) is electrically coupled to the second source/drain feature. A width of the source line is greater than a width of that metal island. By increasing the width of the source line, the resistance in the source line is reduced and the performance of the MRAM device is improved.

Figure 1:
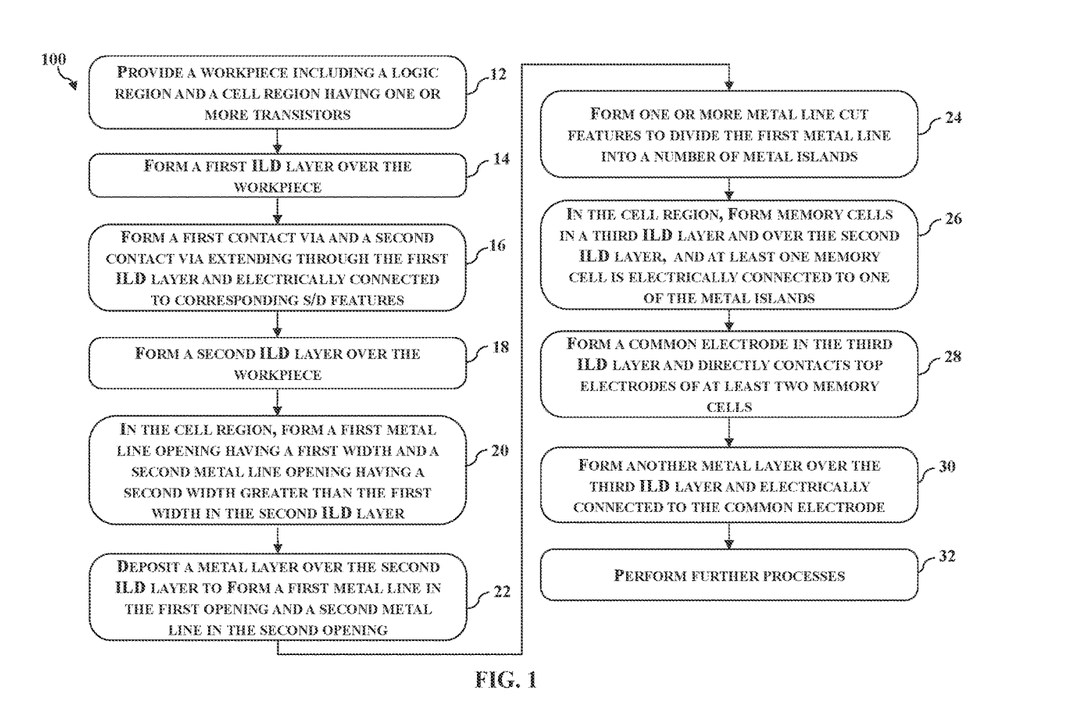
FIG. 1 illustrates a flowchart of a method for forming a semiconductor device, according to one or more aspects of the present disclosure.

The various aspects of the present disclosure will now be described in more detail with reference to the figures. FIG. 1 illustrates a flowchart illustrating method 100 for forming a semiconductor device according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with FIGS. 2-6, 7A, 7B, 8, which include fragmentary cross-sectional or top views of a workpiece 200 at different stages of fabrication according to embodiments of method 100. For avoidance of doubts, throughout the figures, the X direction is perpendicular to the Y direction and the Z direction is perpendicular to both the X direction and the Y direction. Because the workpiece 200 will be formed into a semiconductor device upon conclusion of its fabrication process, the workpiece 200 may be referred to as a semiconductor device 200 as the context requires. Exemplary electrical characterization simulation results of the semiconductor device 200 are shown in FIGS. 9A-9B.

Figure 2:
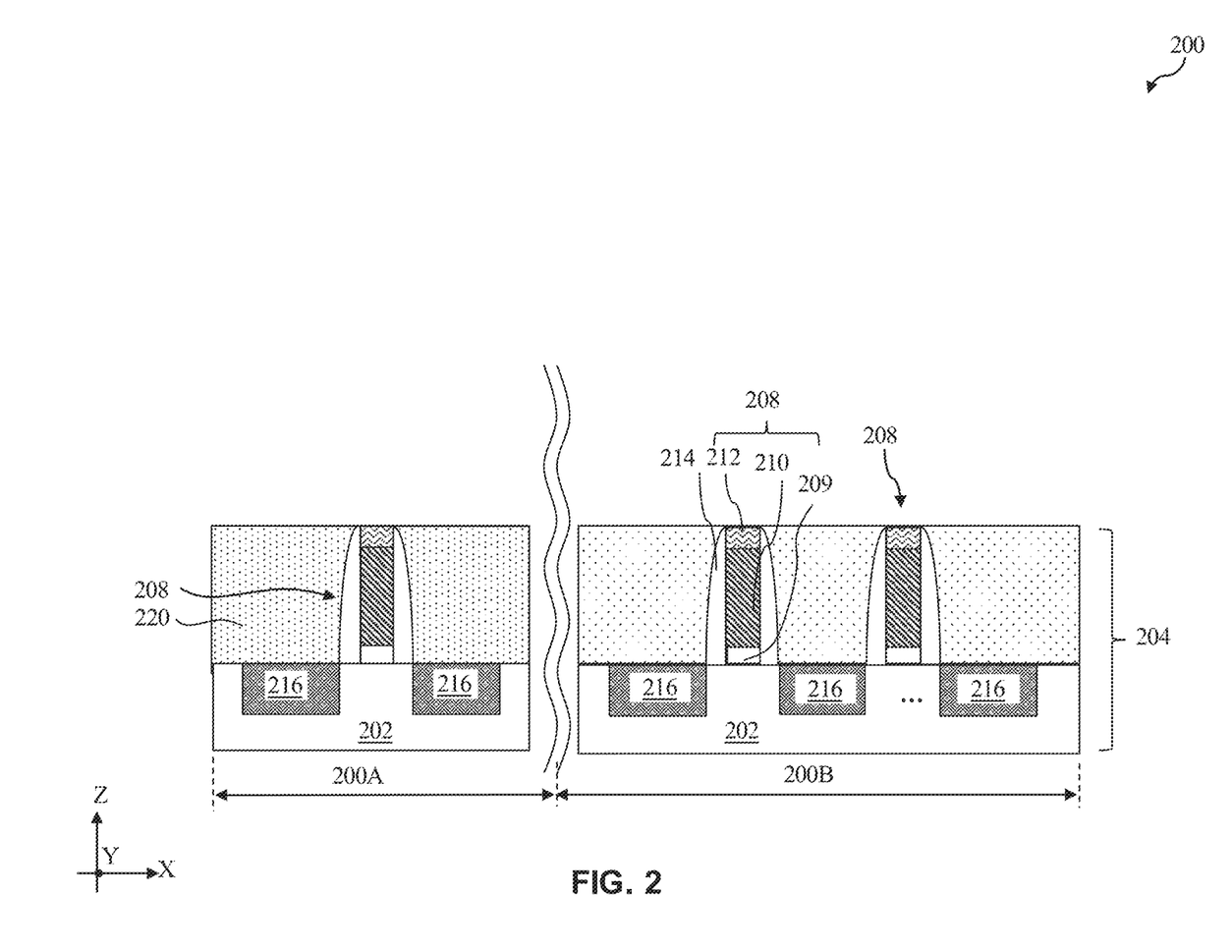
FIGS. 2-6 illustrate fragmentary cross-sectional views of a workpiece at various stages of fabrication of the method in FIG. 1, according to one or more aspects of the present disclosure.

Referring to FIGS. 1 and 2, method 100 includes a block 12 where a workpiece 200 including one or more transistors is received. As shown in FIG. 2, the workpiece 200 includes a first region 200A and a second region 200B. The first region 200A may include a logic region and the second region 200B may include MRAM cell region. The workpiece 200 includes a substrate 202 and various features formed thereon. The substrate 202 may include elementary semiconductor such as silicon, germanium; a compound semiconductor, such as silicon carbide, gallium arsenide, gallium phosphide, indium phosphide, indium arsenide, and/or indium antimonide, or group II-VI materials; an alloy semiconductor, such as silicon germanium, gallium arsenic phosphide, aluminum indium arsenide, aluminum gallium arsenide, gallium indium arsenide, gallium indium phosphide, and/or gallium indium arsenic phosphide; or combinations thereof. In some implementations, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. The substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants.

Isolation features can be formed over and/or in substrate 202 to isolate various regions, such as device regions, of semiconductor device 200. For example, isolation features define and electrically isolate active device regions and/or passive device regions from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. In some embodiments, isolation features can be formed by depositing an insulator material over substrate 202 after forming fin structures (in some embodiments, such that the insulator material layer fills gaps (trenches) between the fin structures) and etching back the insulator material layer.

The workpiece 200 also includes one or more transistor structures 204 formed in each of the logic region 200A and the MRAM cell region 200B. In this depicted example, the transistor structures 204 in the logic region 200A and the MRAM cell region 200B are substantially identical. In some embodiments, the transistor structures 204 may be metal-oxide-semiconductor field-effect transistors (MOSFETs). In some implementations, the transistor structures 204 may be multi-gate devices. Here, a multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may take form of nanowires, nanosheets, or other nanostructures and for that reasons, an MBC transistor may also be referred to as a nanowire transistor or a nanosheet transistor. For illustration purposes and not to limit the scope of the present disclosure, the transistor structures 204 in the figures are depicted as FinFETs.

Each transistor structure 204 includes a gate structure 208 disposed over the substrate 202. The gate structure 208 includes a gate dielectric layer 209 and a gate electrode 210 over the gate dielectric layer 209. The gate dielectric layer 209 may include an interfacial layer and a high-k dielectric layer. In some instances, the interfacial layer may include silicon oxide. The high-k dielectric layer is formed of dielectric materials having a high dielectric constant, for example, greater than a dielectric constant of silicon oxide (k≈3.9). Exemplary high-k dielectric materials for the high-k dielectric layer include hafnium oxide, titanium oxide, hafnium zirconium oxide, tantalum oxide, hafnium silicon oxide, zirconium oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode 210 may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum, copper, tungsten, ruthenium, titanium, a suitable metal, or a combination thereof.

Sidewalls of the gate structures 208 are lined with gate spacers 214. In some embodiments, the gate spacer 214 may include silicon carbonitride, silicon oxycarbide, silicon oxycarbonitride, or silicon nitride. In some embodiments, a gate replacement or a gate last process may be used to form the gate structures 208. In an example gate last process, dummy gate stacks are formed over substrate 202. The gate spacers 214 are then deposited over the workpiece 200, including over sidewalls of the dummy gate stacks. An anisotropic etch process may be then performed to recess source/drain (S/D) regions to form S/D trenches. After formation of the S/D trenches, S/D features 216 are deposited into the source/drain trenches. The S/D features 216 may be formed vapor-phase epitaxy (VPE), ultra-high vacuum CVD (UHV-CVD), LPCVD, and/or PECVD), molecular beam epitaxy (MBE), or other suitable epitaxy processes, or combinations thereof. The S/D features 216 may also be referred to as epitaxial features. Depending on the design of the semiconductor device 200, S/D features 216 may be n-type or p-type. When the S/D features 216 are n-type, they may include silicon (Si) doped with an n-type dopant, such as phosphorus (P) or arsenic (As). When the S/D features 216 are p-type, they may include silicon germanium (SiGe) doped with a p-type dopant, such as boron (B) or gallium (Ga). In some implementations, annealing processes may be performed to activate dopants in S/D features 216 of the semiconductor device 200.

A bottom interlayer dielectric (ILD) layer 220 is formed over the workpiece 200. The bottom ILD layer 220 may include $SiO_2$, tetraethylorthosilicate (TEOS) formed oxide, phosphosilicate glass (PSG), borophosphosilicate glass (BPSG), low-k dielectric material (k<3.9), other suitable dielectric material, or combinations thereof. The bottom ILD layer 220 may be deposited using atomic layer deposition (ALD), plasma-enhanced ALD (PEALD), plasma-enhanced chemical vapor deposition (PECVD), and/or other suitable deposition processes. While not explicitly shown, the workpiece 200 may also include a contact etch stop layer (CESL) disposed between the S/D features 216 and the bottom ILD layer 220. The CESL may include silicon nitride or silicon oxynitride. The workpiece 200 is then planarized using a chemical mechanical polishing (CMP) process to expose the dummy gate stacks. The dummy gate stacks are then removed and replaced with the gate structures 208, the composition of which has been described above. In some embodiments, the gate structures 208 may also include a self-aligned contact dielectric (SAC) layer 212 formed over the gate structure 208. The SAC layer 212 may include a dielectric material such as silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof.

Figure 3:
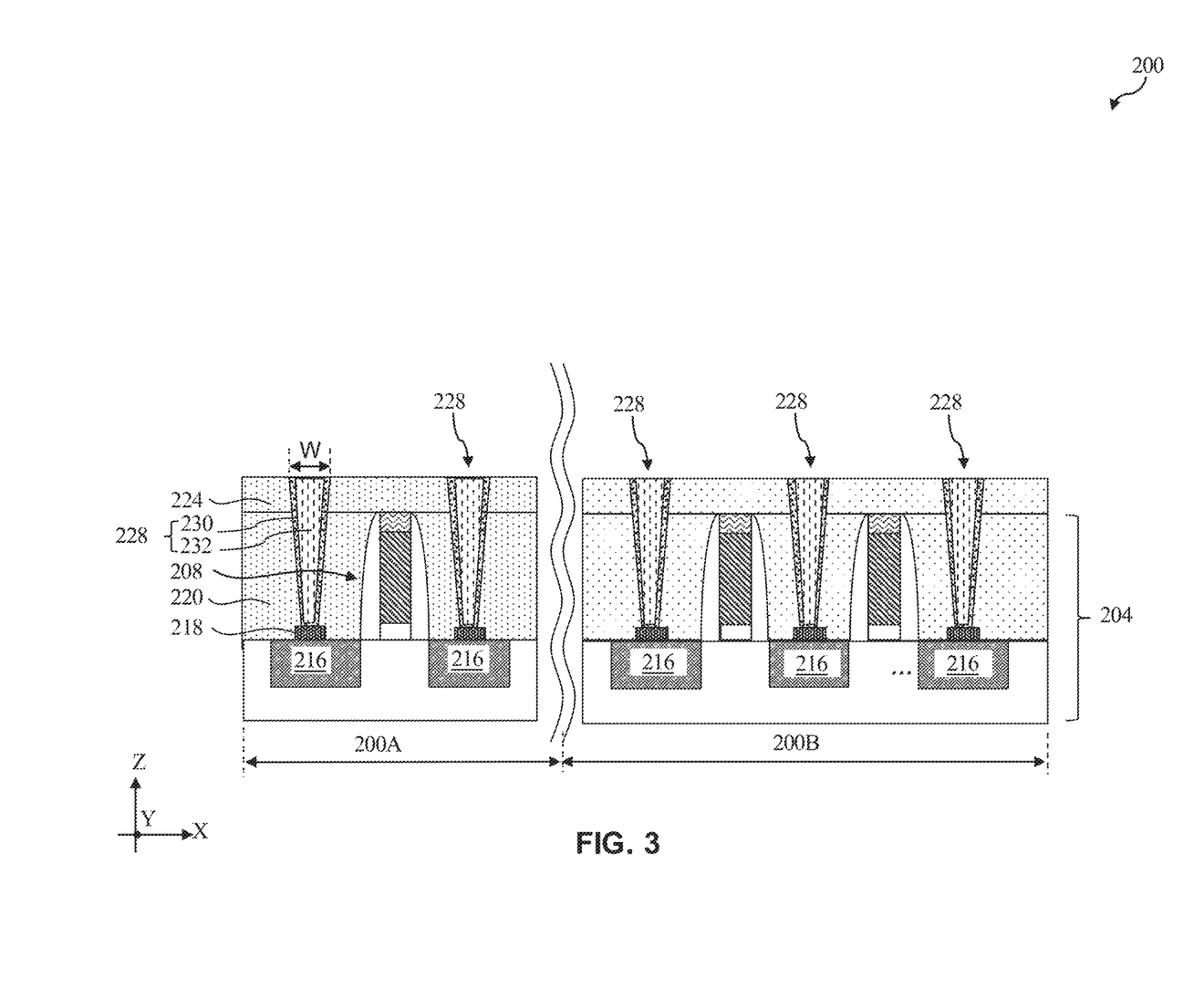

Referring to FIGS. 1 and 3, the method 100 includes a block 14 where a first ILD layer 224 is formed over the workpiece 200 and a block 16 where a number of source/drain contact vias 228 are formed over S/D features 216. In some instances, the first ILD layer 224 includes a thickness along the Z direction and the thickness is between about 11 nm and about 20 nm. The material and the processes used for forming the first ILD layer 224 may be in a way similar to the material and the processes used for forming the bottom ILD layer 220. A number of processes may be implemented to form the source/drain contact vias 228. For example, one or more contact via openings (not shown) may be formed to expose surfaces of the S/D features 216. In some embodiments, the contact via openings may be formed by etching the first ILD layer 224 and the bottom ILD layer 220 to expose a portion of the S/D features 216. In some embodiments, after forming the contact via openings, a silicide layer 218 may be formed on the S/D features 216. In this depicted example, to form the S/D contact vias 228, a barrier layer 230 is first conformally deposited over the first ILD layer 224 and into the contact via openings using a suitable deposition technique, such as an ALD process, a PVD process or a CVD process, and a metal fill layer 232 is deposited over the barrier layer 230 using a suitable deposition technique, such as an ALD process, a PVD process or a CVD process. The barrier layer 230 may be formed of tungsten, ruthenium, cobalt, copper, molybdenum, titanium nitride, or tantalum nitride. The metal fill layer 232 may be formed of tungsten, ruthenium, cobalt, copper, molybdenum, aluminum, or an alloy thereof. Along the Z direction, the top surface of the contact vias 228 may have, for example, a circular shape, an oval shape, a racetrack shape, a square shape, or a rectangular shape.

Figure 4:
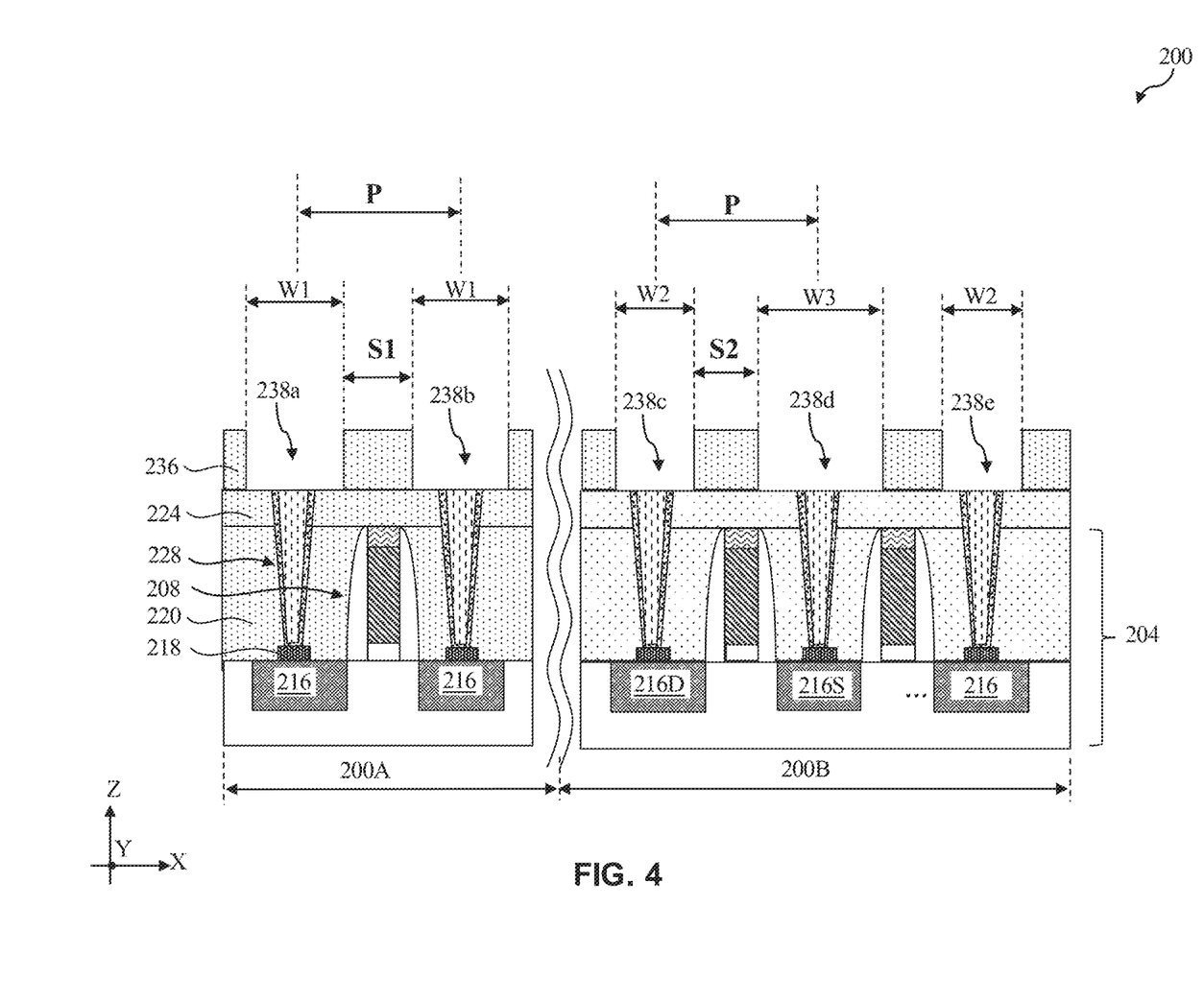

Referring to FIGS. 1 and 4, the method 100 includes a block 18 where a second ILD layer 236 is formed over the workpiece 200 and a block 20 where the second ILD layer 236 is patterned to have a number of metal line openings with different widths. The material and processes used for forming the second ILD layer 236 may be in a way similar to those used for forming the bottom ILD layer 220. In some embodiments, before the deposition of the second ILD layer 236, an etch stop layer (ESL) (not shown) may be deposited over the workpiece 200. Such an ESL may include silicon nitride or silicon oxynitride. After forming the second ILD layer 236, a number of metal line opening (e.g., metal line openings 238a, 238b in the logic region 200A and metal line openings 238c, 238d, 238e in the cell region 200B) are formed in the second ILD layer 236 for forming metal lines. The formation of the metal line openings may involve multiple processes such as lithography and etching processes. The lithography may include a high-resolution lithography (e.g., Extreme Ultraviolet (EUV) Lithography). Conventionally, transistor structures 204 in the logic region 200A and the MRAM cell region 200B share substantially similar dimensions, and corresponding metal lines in the second ILD layer 236 that associated with the corresponding source feature and the corresponding drain feature are also substantially identical in terms of dimensions, pitches, spacings, and materials such that the source feature and the drain feature of the transistor structure 204 have symmetric electrical characteristics and are interchangeable without impacting the transistor's performance.

According to one or more aspects of the present disclosure, the second ILD layer 236 is patterned such that the metal line openings (e.g., metal line openings 238a and 238b) in the logic region 200A are substantially identical, while the metal line openings (e.g., metal line openings 238c and 238d) in the MRAM cell region 200B have different sizes. More specifically, the metal line openings 238a and 238b in the second ILD layer 236 are substantially identical and each have a width W1 along the X direction. A pitch P of the metal line openings 238a and 238b, measured along the X direction, may be a sum of a spacing S1 between the metal line openings 238a and 238b and a width W1 of one of the two metal line openings 238a/238b. Alternatively stated, the pitch P may be calculated or expressed as P=S1+W1. In some embodiments, the width W1 may be between about 10 nm and 40 nm. For example, the width W1 may be between about 20 nm and about 30 nm. The spacing S1 may be between about 10 nm and about 40 nm.

In the cell region 200B, the opening 238c over the drain feature 216D and the opening 238d over the source feature 216S are formed to intentionally have different dimensions and a width difference between a width W2 of the opening 238c and a width W3 of the opening 238d is greater than process errors. This is contrary to the conventional wisdom as uneven metal line openings mean uneven metal line widths, which may lead to unsymmetrical resistance or performance for the source and the drain. In this depicted example, the opening 238c has a width W2 along the X direction and the opening 238d has a width W3 along the X direction. W3 is greater than the width W2 and a difference between W2 and W3 is greater than the process errors. Ideally, the width W3 is maximized and the width W2 is minimized provided that the width W2 is greater than a width W (shown in FIG. 3) of the contact via 228 to ensure satisfactory landing and ensure that the spacing S2 between the opening 238c and the opening 238d does not result in excessive parasitic capacitance. In some embodiments, the width W2 may be between about 10 nm and about 20 nm. The width W3 is greater than W2 and may be between about 30 nm and about 50 nm. A difference between the width W2 and W3 may be between about 10 nm and 40 nm. The metal line openings 238c and 238d in the cell region 200B have the same pitch P as the metal line openings 238a and 238b in the logic region 200A. With respect to the cell region 200B, the pitch P is measured between a center of the opening 238c and a center of an adjacent opening 238d. Mathematically speaking, the pitch P may be calculated or expressed as P=S2+½*W2+½*W3, where S2 is the spacing between the opening 238c and the opening 238d. The spacing S2 may be between 10 nm and 20 nm. In some embodiments, the spacing S2 may be equal to the spacing S1. In some embodiments, the spacing S2 may be less than the spacing S1.

Figure 5:
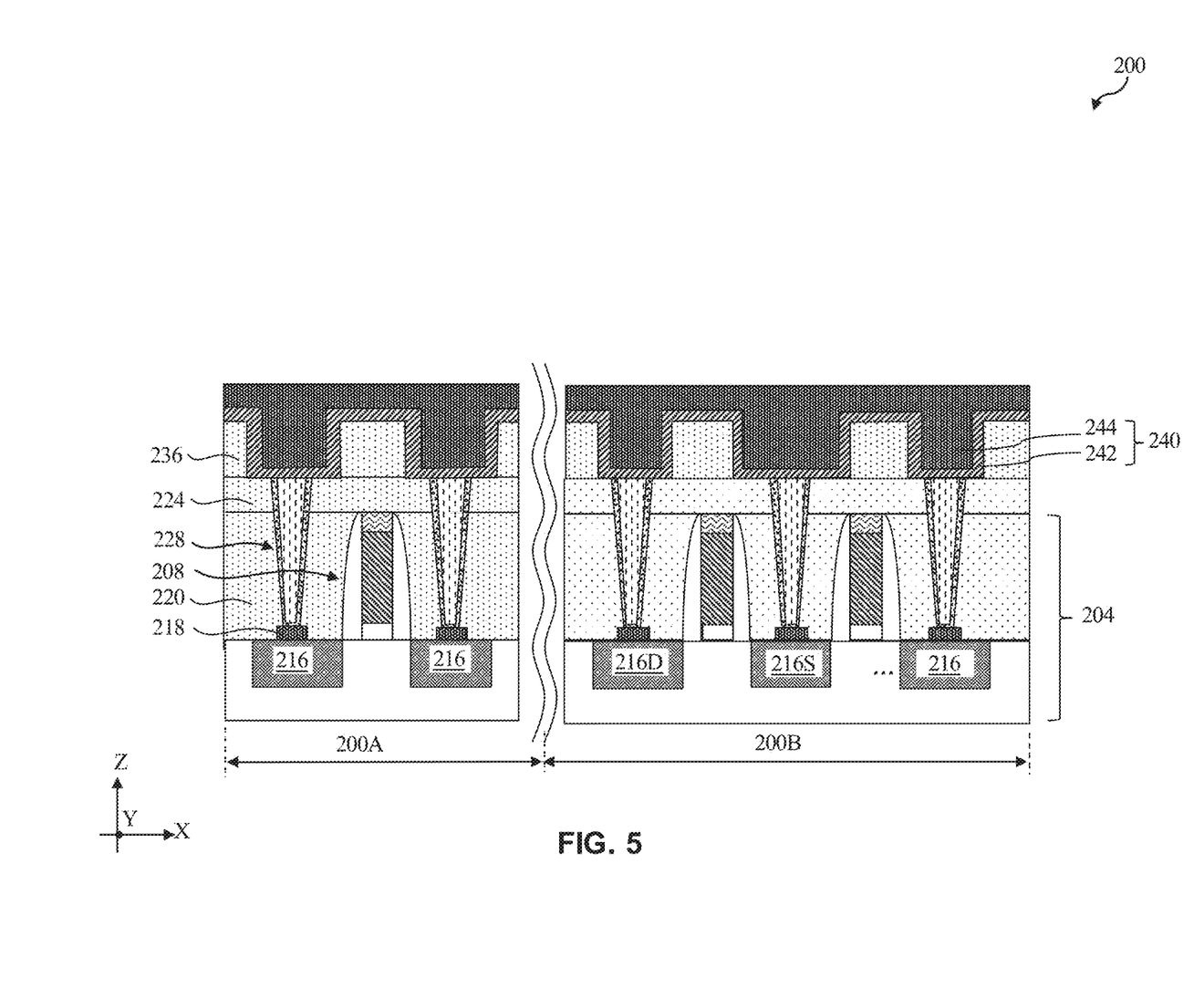
Figure 6:
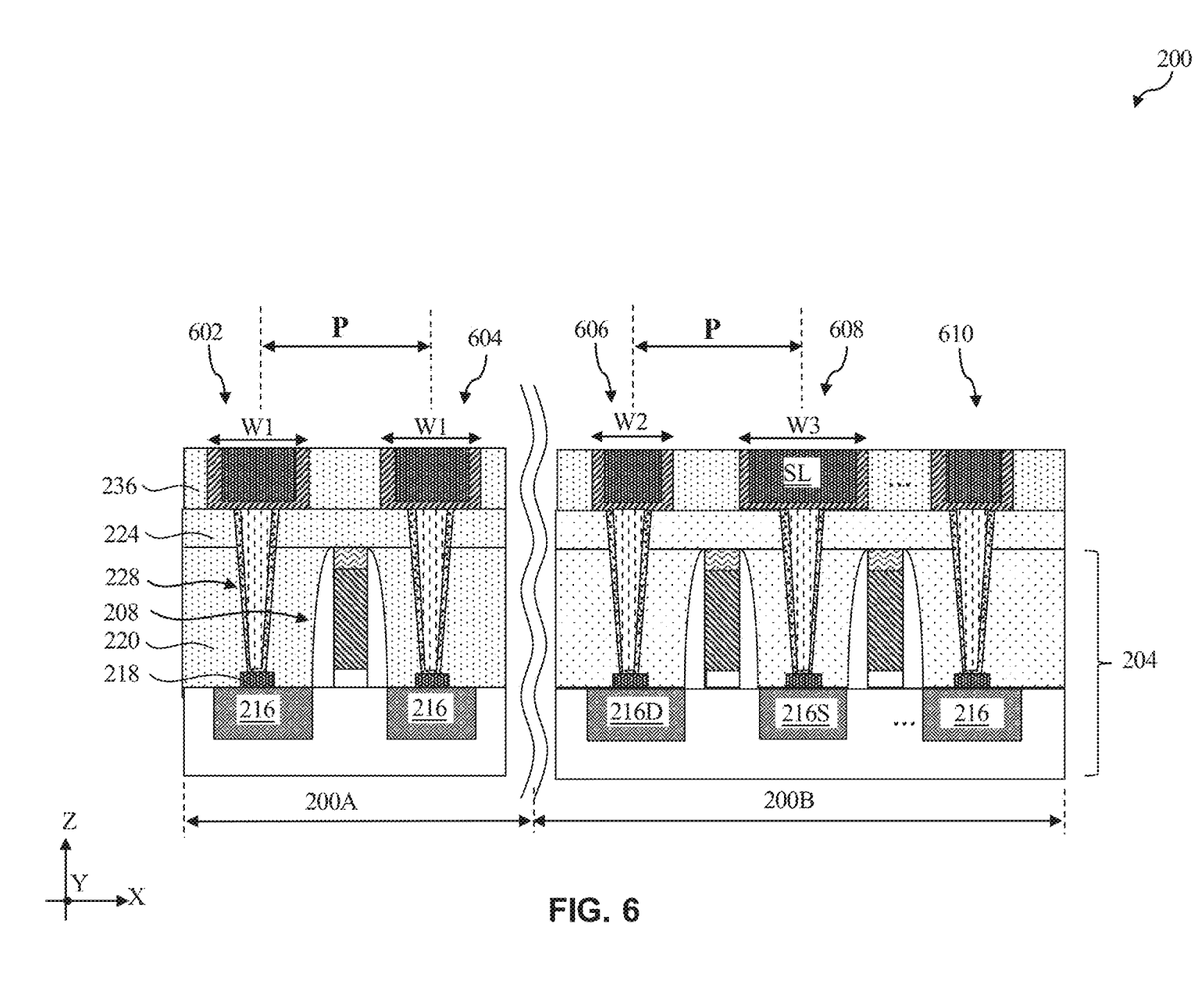

Referring to FIGS. 1 and 5-6, the method 100 includes a block 22 where a metal layer is deposited over the workpiece 200 and fills the metal line openings in the logic region 200A and cell region 200B. With reference to FIG. 5, a barrier layer 242 is conformally formed over workpiece 200. The fabrication processes and material used for forming the barrier layer 242 may be in a way similar to those used for forming the barrier layer 230. Still referring to FIG. 5, a metal fill layer 244 is formed over the barrier layer 242 using a suitable deposition technique, such as an ALD process, a PVD process or a CVD process. The metal fill layer 244 may be formed of tungsten, ruthenium, cobalt, copper, molybdenum, or an alloy thereof. The combination of the barrier layer 242 and the metal fill layer 244 may be referred as to a metal line layer 240.

As shown in FIG. 6, after the deposition of the metal line layer 240, the workpiece 200 is planarized, for example, using a chemical mechanical polishing (CMP) process or other suitable processes to expose the top surface of the second ILD layer 236 and thus form the metal lines (e.g., metal lines 602, 604, 606, 608, and 610) in the corresponding metal line openings (e.g., metal line openings 238a, 238b, 238c, 238d, and 238e). A thickness of the metal line layer 240 may be between about 10 nm and about 40 nm. Since the metal line openings are formed with different widths, the metal lines formed in the corresponding openings will track the shape of the corresponding openings and each metal line would have the width same as the corresponding meta line opening. In other words, along the X direction, the metal lines 602 and 604 have the width W1, the metal lines 606 and 610 have the width W2, and the metal line 608 has the width W3. As described above, the width W2 may be between about 10 nm and 20 nm. The width W3 is greater than W2 and may be between about 30 nm and 50 nm. A difference between the width W2 and W3 may be between about 10 nm and 40 nm and is greater than the process errors. The metal lines for source/drain features of a transistor in the cell region 200B have the same pitch P as the metal lines for source/drain features of a transistor in the logic region 200A.

Figure 7A:
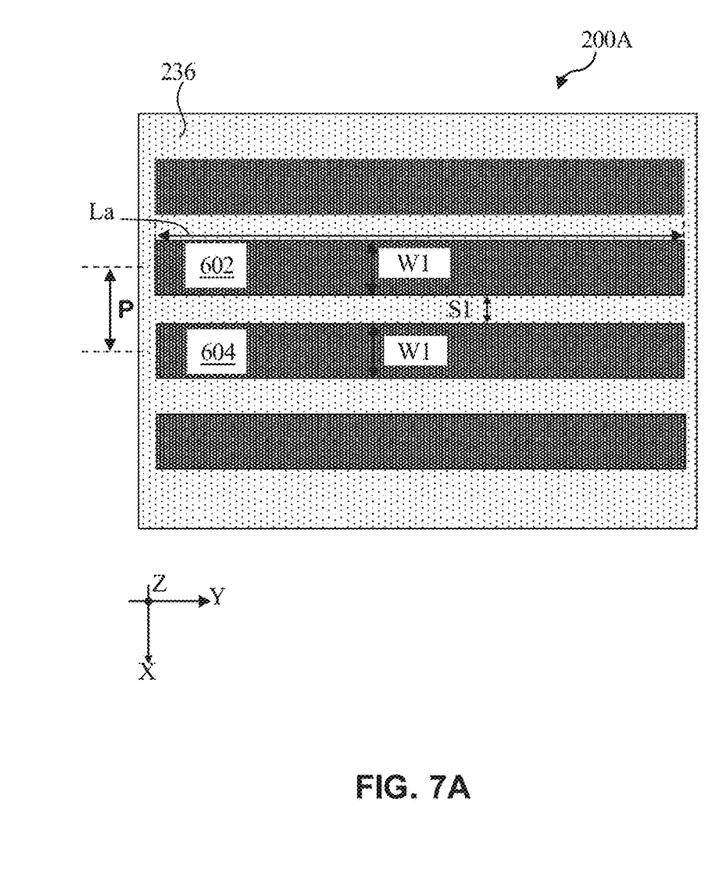
FIG. 7A illustrates a fragmentary top view of a portion of the workpiece undergoing the method according to various aspects of the present disclosure.
Figure 7B:
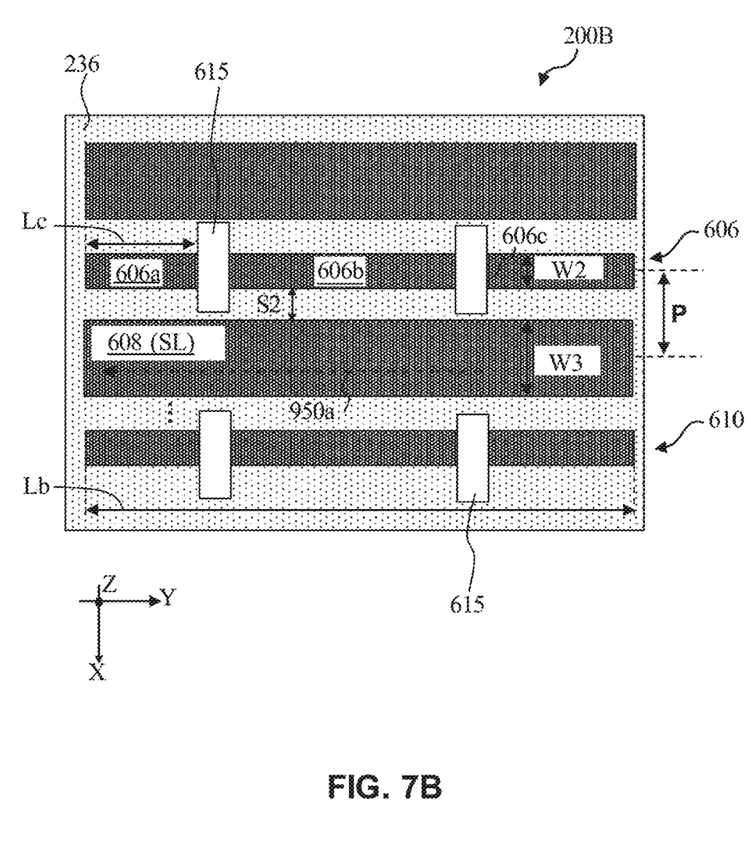
FIG. 7B illustrates a fragmentary top view of a portion of the workpiece undergoing the method according to various aspects of the present disclosure.

Referring to FIGS. 1 and 7A-7B, the method 100 includes a block 24 where each of the metal lines 606 and 610 is divided into several metal islands. FIG. 7A illustrates a fragmentary top view of a portion of the logic region 200A undergoing the method 100 according to various aspects of the present disclosure. The metal lines 602 and 604 each have a length (along the Y direction) La. The length La may be between about 10 um and 20000 um. FIG. 7B illustrates a fragmentary top view of a portion of the cell region 200B undergoing the method 100 according to various aspects of the present disclosure. The metal lines 606 and 610 each have a length (along the Y direction) Lb. The length Lb may be between about 10 um and 20000 um. Each of the metal lines 606 and 610, which has the width W2 along the X direction in the cell region 200B, will be divided by one or more cut features 615 into at least two metal islands. In this depicted example, two cut features 615 are formed to divide the metal line 606 into three metal islands 606a, 606b, and 606c. Each metal island may be electrically connected to a respective drain feature of a corresponding driving transistor. The formation of the cut features may include multiple processes. For example, photolithography processes and etch processes may be performed to form two cut feature openings (not shown) in the metal line 606. A dielectric material layer may be then deposited to fill the two cut feature openings in the metal line 606. A CMP process may be performed to remove excess dielectric material to form the metal line cut features 615. In some embodiments, the cut features 615 may include silicon oxide, silicon oxycarbonitride, silicon nitride, a low-k dielectric material, or a combination thereof. Other suitable processes may also be used to form the metal line cut features 615 and the metal islands 606a, 606b, and 606c. The metal line cut features 615 electrically and physically divides the metal line 606 into three metal islands 606a, 606b, and 606c. The metal islands 606a, 606b, and 606c may have same or different lengths along the Y direction. In this depicted example, a length Lc of the metal island 606a may be less than about 100 nm and is less than the length Lb. In this depicted example, a shape of a top view of the metal island 606a includes a substantially rectangular shape. In some embodiments, other shapes may be possible. For example, the length Lc of the metal island 606a may be equal to the width W2 of the metal island 606a and thus a shape of a top view of the metal island 606a may include a substantially square shape.

Figure 8:
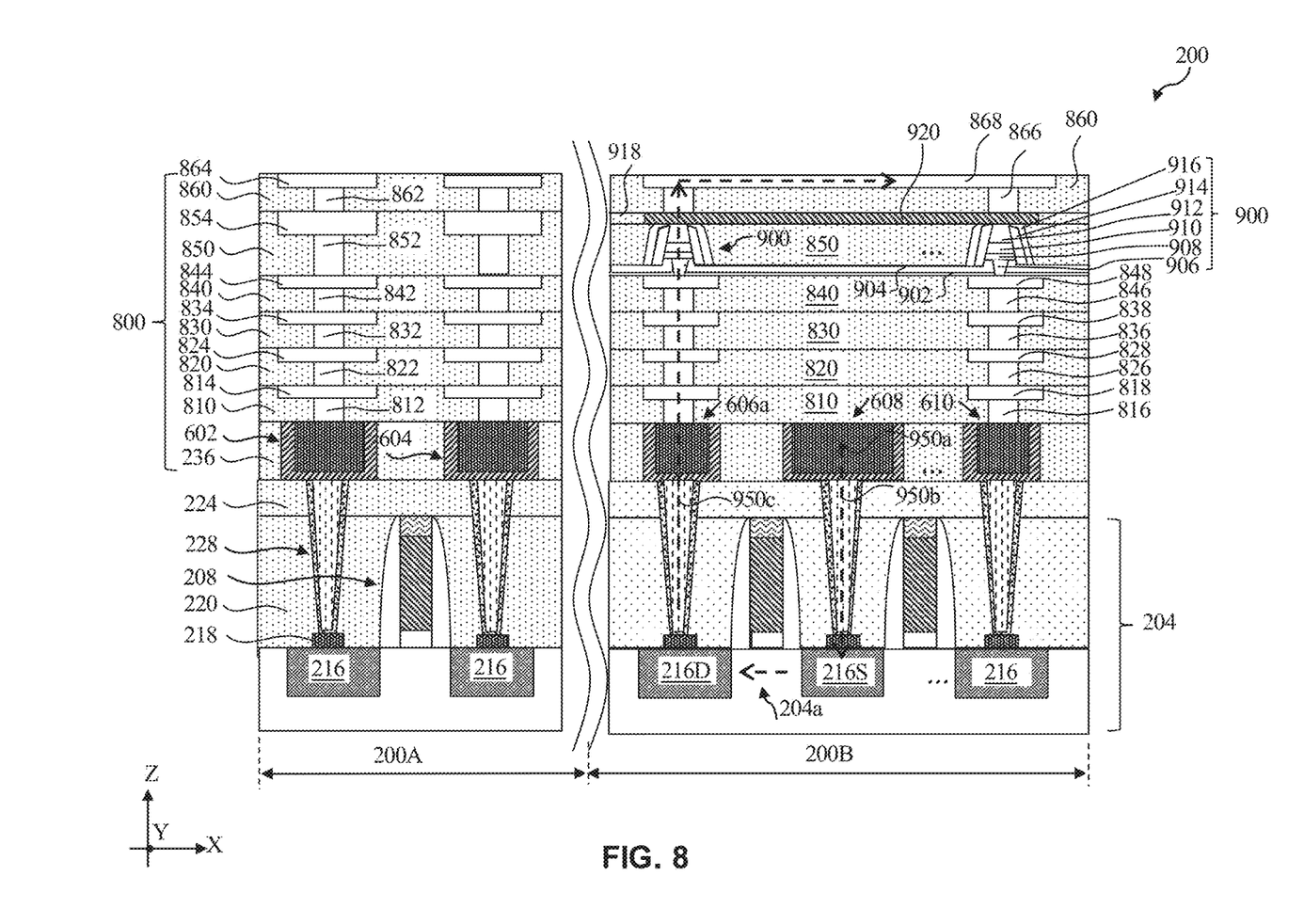
FIG. 8 illustrates a fragmentary cross-sectional view of the workpiece at various stages of fabrication of the method in FIG. 1, according to one or more aspects of the present disclosure.
Figure 9A:
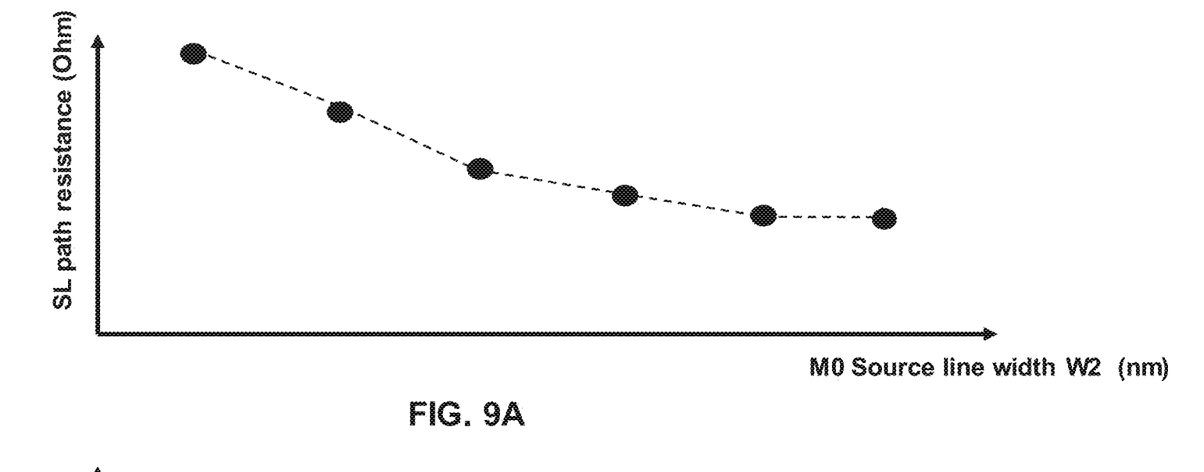
FIG. 9A illustrates improvements to reduce a resistance along a source line path according to one or more aspects of the present disclosure.
Figure 9B:
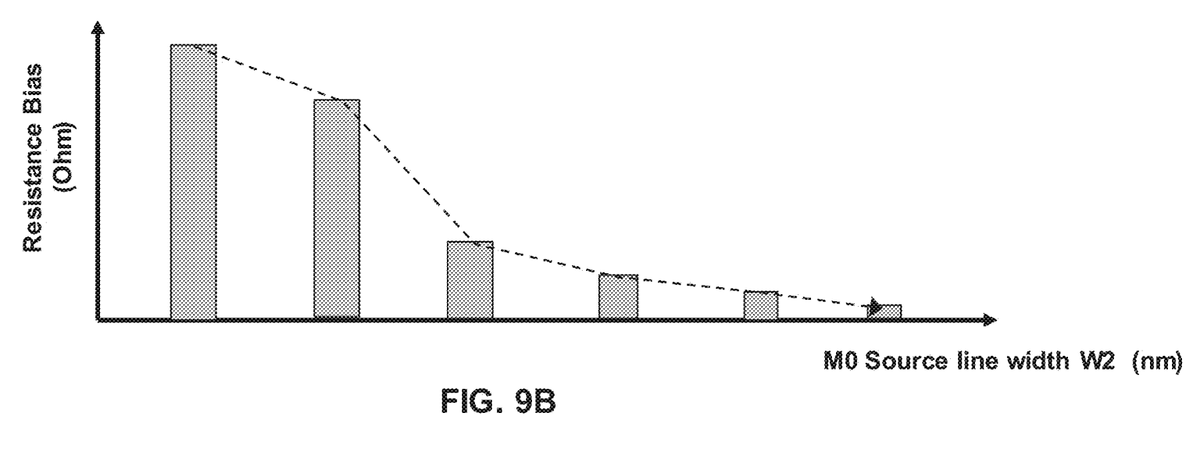
FIG. 9B illustrates improvements to reduce a resistance loading between the source line path and a parallel resistance between a bit line and a common electrode, according to one or more aspects of the present disclosure.

Referring to FIGS. 1 and 8, the method 100 includes a block 26 where one or more MRAM cells are formed over the metal lines in the cell region 200B. As shown in FIG. 8, after forming the metal lines (e.g., metal lines 602, 604, 608) and metal islands (e.g., metal islands 606a-606c) in the second ILD layer 236, other features of an interconnect structure 800 are formed over the second ILD layer 236. The interconnect structure 800 may include between about 5 and about 8 interconnect layers, each of which includes contact vias (e.g., contact vias 812, 822, 832, 842, 852, 862 in the logic region 200A and contact vias 816, 826, 836, 846, 866 in the cell region 200B) and conductive lines (e.g., conductive lines 814, 824, 834, 844, 854, 864 in the logic region 200A and conductive lines 818, 828, 838, 848, 868 in the cell region 200B) embedded in an intermetal dielectric (IMD) layer (e.g., dielectric layers 236, 810, 820, 830, 840, 850, 860). The material and processes used for forming the IMD layers over the second ILD layer 236 may be in a way similar to those used for the ILD layer 220. The materials and processes used for forming the contact vias and conductive lines over the second ILD layer 236 may be in a way similar to those used for the contact via 228 and metal lines 602, respectively.

As described above, MRAM cells 900 may be embedded in the interconnect structure 800. In this depicted example, MRAM cells 900 will be embedded in the fifth interconnect layer, which includes the IMD layer 850. After forming a lower IMD 840, a bottom etch stop layer 902 and a bottom dielectric layer 904 are deposited in the cell region 200B. A number of bottom contact vias 906 are then formed to extend through the bottom dielectric layer 904 and the bottom etch stop layer 902 and directly contact the conductive features 848 in the lower IMD 840, respectively. MRAM cells 900 are formed over the lower IMD 840. Each of the MRAM cell 900 includes a bottom electrode 908 disposed over the bottom contact via 906, an MTJ structure 910 disposed over the bottom electrode 908, and a top electrode 912 disposed over the MTJ structure 910. The formation of the bottom electrode 908, MTJ structure 910 and the top electrode 912 may involve multiple processes such as deposition and patterning. The top electrode 912 and the bottom electrode 908 may be formed of the same material. For example, the top electrode 912 and the bottom electrode 908 may be formed of titanium nitride, copper, tungsten, or nickel. As each of the bottom electrodes 908 is electrically coupled to a corresponding bottom contact via 906, the bottom electrode 908 is thus electrically connected to a corresponding metal island (e.g., metal island 606a) through the intervening conductive features in the interconnect structure 800. While not explicitly shown in FIG. 8, the MTJ structure 910 is configured to store data and includes a pinned layer, a tunnel barrier layer over the pinned layer, and a free layer disposed over the tunnel barrier layer. In some embodiments, the pinned layer may include cobalt, iron, boron, ruthenium, or the like. The tunnel barrier layer may include magnesium oxide, aluminum oxide, or the like. The free layer may include cobalt, iron, boron, or the like. For passivation purposes, sidewalls of the top electrode 912, the MTJ structure 910 and the bottom electrode 908 are lined by a first passivation layer 914 and a second passivation layer 916. In some instances, the first passivation layer 914 includes silicon nitride or silicon carbonitride and the second passivation layer 916 includes aluminum oxide, zirconium oxide, or hafnium oxide. After forming the MRAM cells 900 in the cell region 200B, an IMD layer 850 is disposed over and between MRAM cells 900. In this illustrated example, the IMD layer 850 is formed in both the logic region 200A and the cell region 200B. The material and fabrication processes used for forming the IMD layer 850 may be in a way similar to those used for forming the bottom ILD layer 220. After the formation of the IMD layer 850, conductive features (e.g., contact via 842 and metal line 844) in the IMD layer 850 in the logic region 200A may be formed in a way similar to the contact via 228 and the metal line 602.

Still referring to FIGS. 1 and 8, the method 100 includes a block 28 where a common electrode 920 is formed on multiple top electrodes 912 of the MRAM cells 900 to enlarge the process window. That is, top electrodes of multiple MRAM cells may be jointly coupled to the common electrode. The formation of the common electrode 920 may involve multiple processes. For example, the IMD layer 850 in the cell region 200B may be etched or planarized (e.g., by using CMP) to expose the multiple top electrodes 912 of the MRAM cells 900. A top etch stop layer 918 may be deposited over the cell region 200B and patterned to form a common electrode opening (not shown). In some implementations, a thickness of the top etch stop layer 918 may be between about 200 Å and about 300 Å. The common electrode 920 is then formed in the common electrode opening. In some embodiments, the material used for forming the common electrode may be in a way similar to that of the metal line 602.

Still referring to FIGS. 1 and 8, the method 100 includes a block 30 where another metal layer is formed over the common electrode. After the formation of the common electrode 920, an upper IMD layer 860 is deposited over workpiece 200. Contact vias 862, 866 and conductive lines 864, 868 are then formed in the upper IMD layer 860 in the corresponding logic region 200A and cell region 200B. As shown in FIG. 8, in the cell region 200B, the contact vias 866 in the upper IMD layer 860 are in direct contact with the common electrode 920. Because the top electrodes 912 are not individually addressed by the contact vias 866, the number of the contact vias 866 in the cell region 200B is less than the number of the top electrodes 912 in the lower IMD layer 840.

Still referring to FIGS. 1 and 8, method 100 includes a block 32 where further processes are performed. Such further processes may include planarization of the workpiece 200 and formation of further interconnect layers over the upper IMD layer 860. In this depicted example, the interconnect structure 800 includes six interconnect layers and the MRAM cells 900 are embedded in the fifth interconnect layer (e.g., the interconnect layer that includes the IMD layer 850). In some embodiments, additional interconnect layers may be fabricated and the interconnect structure 800 may include 7 or even more interconnect layers, and the MRAM cells 900 may be embedded one of the interconnect layer between the $3^{rd}$ interconnect layer and the $8^{th}$ interconnect layer.

The advantages of the different widths of the metal line 608 and the metal island 606a may be described with reference to FIG. 8. In the cell region 200B, the bottom electrode 908 of the MRAM cell 900 is electrically coupled to the drain feature 216D of the transistor 204a by way of the conductive features (e.g., conductive lines and contact vias) and the metal island 606a in the interconnect structure 800. The top electrode 912 of the MRAM cell 900 is electrically coupled to the conductive line 868 in the upper IMD layer 860. The conductive line 868 serves as a bit line and may also be referred to as a bit line (BL) 868. The metal line 608 is electrically connected to source feature 216S of the transistor 204a by way of the source contact via 228. The metal line 608 serves as a source line and may also be referred to as a source line (SL) 608. An exemplary current path is also shown in FIG. 7B and FIG. 8. For example, during the write operation of the MRAM cell 900, a write signal travels along the source line 608 or path 950a shown in FIG. 7B in the Y direction, travels downwards along a path 950b through the source contact via 228, and travels upwards along a path 950c through the metal island 606a and various interconnect layers to the MRAM cell 900. The common electrode 920 is connected in parallel with the bit line (BL) 868 in providing the read signal. As discussed above, during read and write operations of the MRAM cell 900, the resistance bias between the observed source line resistance (e.g., including a resistance along the path 950a shown in FIG. 7B) and the observed bit line resistance (i.e., parallel resistance between the bit line 868 and the common electrode 920) may impact performance of the MRAM cell 900. The resistance for a conductive line is not only related to the materials of forming the conductive line, but also related to the dimension (e.g., length, width, and thickness) of the conductive line. By increasing the width (i.e., increasing from width W1 to width W3) of the source line (SL) 608, the resistance along the path 950a (shown in FIG. 7B) will be advantageously reduced. Since the metal island 606a is in the vertical current path 950c between the driving transistor (e.g., driving transistor 204a) and the bottom electrode (e.g., bottom electrode 908) of an MRAM cell (e.g., MRAM cell 900), the metal island 606a does not pose as a resistance bottleneck as long as its cross-sectional area (i.e., Lc*W2) and width W2 are greater than the corresponding cross-sectional areas and widths of the contact vias (e.g., contact via 816 and contact via 228) connected thereto, respectively. Thus, reducing the width (i.e., decreasing from width W1 to width W2) along the X direction of the metal island 606a would not increase the resistance in the path 950c. Therefore, a total resistance observed from the source line (e.g., along the path 950a, 950b, and 950c) will be advantageously reduced without changing the pitch (shown in FIGS. 6, 7A-7B) between the metal line 606 and metal line 608. Power consumption of the semiconductor device 200 may also be advantageously reduced.

Due to smaller dimensions of conductive features in the metal layers below the MRAM cell, the resistance in the source line (SL) path may be much greater than the parallel resistance in the bit line. One or more aspects of the present disclosure increase the width of the source line 608 and thus reduce the resistance bias and balance the resistances for the read operation and the write operation. FIGS. 9A-9B illustrate corresponding simulation results that show the improvements of reducing the source line resistance along the path 950a and the resistance bias in response to the width of the source line 608.

In one exemplary aspect, the present disclosure is directed to a semiconductor structure. The semiconductor device structure includes a first source/drain feature and a second source/drain feature, a first metal line disposed in a first dielectric layer and electrically connected to the first source/drain feature, a second metal line disposed in the first dielectric layer and electrically connected to the second source/drain feature, and a first memory element disposed over the first dielectric layer and electrically connected to the first source/drain feature by way of the first metal line. A width of the first metal line is different from a width of the second metal line.

In some embodiments, the width of the first metal line may be less than the width of the second metal line. In some embodiments, the first metal line and the second metal line may extend lengthwise along a direction, and a length of the first metal line along the direction may be smaller than a length of the second metal line along the direction.

In some embodiments, the semiconductor structure may also include a first contact via in direct contact with both the first source/drain feature and the first metal line, and a second contact via in direct contact with both the second source/drain feature and the second metal line.

In some embodiments, the first memory element may include a magneto-resistive random-access memory cell. The magneto-resistive random-access memory cell may include a bottom electrode disposed over the first dielectric layer and electrically connected to the first metal line, a storage material disposed over the bottom electrode, and a first top electrode disposed over the storage material.

In some embodiments, the semiconductor structure may also include a plurality of conductive features disposed between the first dielectric layer and the first memory element, the plurality of conductive features electrically couple the first metal line to the bottom electrode.

In some embodiments, the semiconductor structure may also include a second memory element disposed over the first dielectric layer, a common electrode disposed over the first memory element and the second memory element and in direct contact with both the first top electrode of the first memory element and a second top electrode of the second memory element, a second dielectric layer disposed over the common electrode, and a third metal line disposed in the second dielectric layer and electrically connected to the common electrode.

In some embodiments, the semiconductor structure may also include a third metal line disposed in the first dielectric layer, and an isolation feature separating the first metal line from the third metal line, a width of the third metal line is substantially equal to the width of the second metal line. The third metal line may be aligned with the first metal line along a lengthwise direction of the first metal line. In some embodiments, a distance between the first metal line and the second metal line may be between about 10 nm and about 20 nm.

In another exemplary aspect, the present disclosure is directed to a semiconductor structure. The semiconductor structure includes a cell region and a logic region. The cell region includes a first source/drain feature and a second source/drain feature, a first metal line disposed in a first dielectric layer and electrically connected to the first source/drain feature, a second metal line disposed in the first dielectric layer and electrically connected to the second source/drain feature, and a first magneto-resistive memory cell disposed over the first dielectric layer and electrically connected to the first source/drain feature by way of the first metal line. The logic region includes a source feature and a drain feature, a third metal line disposed in the first dielectric layer and electrically connected to the source feature, and a fourth metal line disposed in the first dielectric layer and electrically connected to the drain feature. A first width of the first metal line is different from a third width of the third metal line.

In some embodiments, a first pitch of the first metal line and the second metal line may be substantially equal to a second pitch of the third metal line and the fourth metal line. In some embodiments, the first width may be smaller than the third width and a second width of the second metal line is greater than the third width. In some embodiments, a difference between the first width and the second width may be greater than process errors.

In some embodiments, the first magneto-resistive random-access memory cell may include a bottom electrode disposed over the first dielectric layer and electrically connected to the first metal line by way of a plurality of conductive features, a storage material disposed over the bottom electrode, and a first top electrode disposed over the storage material.

In some embodiments, the cell region may also include a second magneto-resistive random-access memory cell disposed over the first dielectric layer and having a second top electrode. The cell region may also include a common electrode disposed over the first magneto-resistive random-access memory cell and the second magneto-resistive random-access memory cell. The common electrode may be in direct contact with the first top electrode and the second top electrode.

In yet another exemplary aspect, the present disclosure is directed to a method. The method includes receiving a workpiece including a first source/drain feature and a second source/drain feature, and a dielectric layer over the first source/drain feature and the second source/drain feature. The method also includes patterning the dielectric layer to form a first opening having a first width and a second opening having a second width different from the first width. The method also includes depositing a metal layer over the dielectric layer to form a first metal line in the first opening and a second metal line in the second opening. The method also includes forming a first memory element over the first metal line. The first memory element is electrically connected to the first source/drain feature by way of the first metal line, and the second metal line is electrically connected to the second source/drain feature.

In some embodiments, the first width may be less than the second width and a difference between the first width and the second width may be between about 10 nm and about than 40 nm. In some embodiments, the method may also include forming a first contact via in direct contact with the first source/drain feature before the patterning of the dielectric layer and forming a second contact via in direct contact with the second source/drain feature. The first metal line may be formed over and in contact with the first contact via and the second metal line is formed over and in contact with the second contact via.

In some embodiments, the forming of the first memory element may also include forming a second memory element, and after the forming of the first memory element and the second memory element, forming a common electrode in another dielectric layer over the first memory element and the second memory element. The common electrode may directly contact both a first top electrode of the first memory element and a second top electrode of the second memory element.

In some embodiments, the method may also include after the depositing of the metal layer over the dielectric layer, forming a third opening that intersects the first metal line, and forming an isolation feature in the third opening to both electrically and physically divide the first metal line into a first metal island and a second metal island, the first memory element may be electrically connected to the first source/drain feature the via the first metal island.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first source/drain feature and a second source/drain feature;
   a first metal line disposed in a first dielectric layer and electrically connected to the first source/drain feature;
   a second metal line disposed in the first dielectric layer and electrically connected to the second source/drain feature; and
   a first memory element disposed over the first dielectric layer and electrically connected to the first source/drain feature by way of the first metal line,
   wherein a width of the first metal line is different from a width of the second metal line, and
   wherein, in a top view, the first metal line and the second metal line extend lengthwise along a same direction, and a length of the first metal line along the direction is smaller than a length of the second metal line along the direction.

2. The semiconductor structure of claim 1, wherein the width of the first metal line is less than the width of the second metal line.

3. The semiconductor structure of claim 1, further comprising:
   a first contact via in direct contact with both the first source/drain feature and the first metal line; and
   a second contact via in direct contact with both the second source/drain feature and the second metal line.

4. The semiconductor structure of claim 1, wherein the first memory element includes a magneto-resistive random-access memory cell comprising:
   a bottom electrode disposed over the first dielectric layer and electrically connected to the first metal line;
   a storage material disposed over the bottom electrode; and
   a first top electrode disposed over the storage material.

5. The semiconductor structure of claim 4, further comprising:
   a plurality of conductive features disposed between the first dielectric layer and the first memory element,
   wherein the plurality of conductive features electrically couple the first metal line to the bottom electrode.

6. The semiconductor structure of claim 4, further comprising:
   a second memory element disposed over the first dielectric layer;
   a common electrode disposed over the first memory element and the second memory element and in direct contact with both the first top electrode of the first memory element and a second top electrode of the second memory element;
   a second dielectric layer disposed over the common electrode; and
   a third metal line disposed in the second dielectric layer and electrically connected to the common electrode.

7. The semiconductor structure of claim 1, further comprising:
   a third metal line disposed in the first dielectric layer; and
   an isolation feature separating the first metal line from the third metal line, wherein a width of the third metal line is substantially equal to the width of the second metal line,
   wherein, in the top view, the third metal line is aligned with the first metal line along the direction.

8. The semiconductor structure of claim 1, wherein a distance between the first metal line and the second metal line is between about 10 nm and about 20 nm.

9. A semiconductor structure comprising:
   a cell region comprising:
      a first source/drain feature and a second source/drain feature,
      a first metal line disposed in a first dielectric layer and electrically connected to the first source/drain feature,
      a second metal line disposed in the first dielectric layer and electrically connected to the second source/drain feature, and
      a first magneto-resistive random-access memory cell disposed over the first dielectric layer and electrically connected to the first source/drain feature by way of the first metal line; and
   a logic region comprising:
      a source feature and a drain feature;
      a third metal line disposed in the first dielectric layer and electrically connected to the source feature, and
      a fourth metal line disposed in the first dielectric layer and electrically connected to the drain feature,
   wherein, a width of the first metal line and a width of the second metal line are different from a width of the third metal line.

10. The semiconductor structure of claim 9, wherein a first pitch of the first metal line and the second metal line is substantially equal to a second pitch of the third metal line and the fourth metal line.

11. The semiconductor structure of claim 10, wherein the width of the first metal line is smaller than the width of the third metal line, and the width of the second metal line is greater than the width of the third metal line.

12. The semiconductor structure of claim 11, wherein a difference between the width of the first metal line and the width of the second metal line is greater than process errors.

13. The semiconductor structure of claim 9, wherein the first magneto-resistive random-access memory cell comprises:
   a bottom electrode disposed over the first dielectric layer and electrically connected to the first metal line by way of a plurality of conductive features;
   a storage material disposed over the bottom electrode; and
   a first top electrode disposed over the storage material.

14. The semiconductor structure of claim 13, wherein the cell region further comprises:
   a second magneto-resistive random-access memory cell disposed over the first dielectric layer and having a second top electrode; and
   a common electrode, disposed over the first magneto-resistive random-access memory cell and the second magneto-resistive random-access memory cell and in direct contact with the first top electrode and the second top electrode.

15. A method, comprising:
   receiving a workpiece comprising:
      a first source/drain feature and a second source/drain feature, and
      a dielectric layer over the first source/drain feature and the second source/drain feature;

patterning the dielectric layer to form a first opening having a first width and a second opening having a second width different from the first width;

depositing a metal layer over the dielectric layer to form a first metal line in the first opening and a second metal line in the second opening;

forming a first memory element and a second memory element over the first metal line, wherein the first memory element and the second memory element are physically isolated, and the first memory element is electrically connected to the first source/drain feature by way of the first metal line, and the second metal line is electrically connected to the second source/drain feature;

forming an etch stop layer over and in direct contact with top surfaces of the first memory element and the second memory element; and forming an electrode extending through the etch stop layer and in direct contact with the top surfaces of the first memory element and the second memory element.

16. The method of claim 15, wherein the first width is less than the second width and a difference between the first width and the second width is between about 10 nm and about 40 nm.

17. The method of claim 15, further comprising:
before the patterning of the dielectric layer, forming a first contact via in direct contact with the first source/drain feature; and,
forming a second contact via in direct contact with the second source/drain feature,
wherein the first metal line is formed over and in contact with the first contact via and the second metal line is formed over and in contact with the second contact via.

18. The method of claim 15, further comprising:
after the depositing of the metal layer over the dielectric layer,
forming an isolation feature to both electrically and physically divide the first metal line into a first metal island and a second metal island, wherein the first memory element is electrically connected to the first source/drain feature the via the first metal island.

19. The semiconductor structure of claim 6, wherein an entirety of a bottom surface of the common electrode is substantially planar.

20. The semiconductor structure of claim 9, wherein the width of the third metal line is substantially equal to a width of the fourth metal line.

* * * * *